United States Patent
Cho et al.

(10) Patent No.: US 7,112,856 B2
(45) Date of Patent: Sep. 26, 2006

(54) SEMICONDUCTOR DEVICE HAVING A MERGED REGION AND METHOD OF FABRICATION

(75) Inventors: Kang-Sik Cho, Kyungki-do (KR);
Gyu-Chul Kim, Kyungki-do (KR);
Hoo-Sung Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/194,181

(22) Filed: Jul. 12, 2002

(65) Prior Publication Data

US 2004/0007744 A1    Jan. 15, 2004

(51) Int. Cl.
*H01L 29/76* (2006.01)
(52) U.S. Cl. ............... 257/384; 257/408; 257/372
(58) Field of Classification Search ............ 257/328, 257/336, 344, 345, 368, 372, 373, 384, 386, 257/408, 503, 547
See application file for complete search history.

(56) References Cited

U.S. PATENT DOCUMENTS

| | | | |
|---|---|---|---|
| 4,821,085 A * | 4/1989 | Haken et al. ............... 257/412 |
| 5,040,037 A * | 8/1991 | Yamaguchi et al. ........ 257/347 |
| 5,243,213 A | 9/1993 | Miyazawa et al. |
| 5,741,735 A | 4/1998 | Violette et al. |
| 5,920,089 A * | 7/1999 | Kanazawa et al. .......... 257/202 |
| 5,965,917 A * | 10/1999 | Maszara et al. ............. 257/347 |
| 6,064,099 A * | 5/2000 | Yamada et al. ............. 257/372 |
| 6,114,733 A * | 9/2000 | Hong ......................... 257/384 |
| 6,147,386 A | 11/2000 | Horiuchi |
| 6,268,630 B1 | 7/2001 | Schwank et al. |
| 6,278,160 B1 | 8/2001 | Park et al. |
| 6,281,088 B1 | 8/2001 | Kim |
| 6,300,661 B1 | 10/2001 | Kadosh et al. |
| 6,339,005 B1 | 1/2002 | Bryant et al. |
| 6,373,103 B1 | 4/2002 | Long et al. |
| 6,441,434 B1 * | 8/2002 | Long et al. .................. 257/347 |
| 6,555,438 B1 * | 4/2003 | Wu ............................ 438/305 |
| 6,624,473 B1 * | 9/2003 | Takehashi et al. .......... 257/344 |
| 2002/0086505 A1 * | 7/2002 | Cheng et al. ............... 438/581 |
| 2002/0096726 A1 * | 7/2002 | Koike ........................ 257/384 |

FOREIGN PATENT DOCUMENTS

| | | |
|---|---|---|
| JP | 11-345952 | 12/1999 |
| JP | 2000-124450 | 4/2000 |
| KR | P1996-0005995 | 2/1996 |
| KR | P2000-0045475 | 7/2000 |

OTHER PUBLICATIONS

English language abstract for Korean Publication No. P2000-045475.

(Continued)

*Primary Examiner*—N. Drew Richards
(74) *Attorney, Agent, or Firm*—Marger Johnson & McCollom, P.C.

(57) ABSTRACT

A semiconductor device includes an insulated gate electrode pattern formed on a well region. The semiconductor device further includes a sidewall spacer formed on sidewalls of the gate electrode pattern. A source region and a drain region are formed adjacent opposite sides of the gate pattern. In accordance with one embodiment of the present invention, one of the source or drain regions includes a first-concentration impurity region formed under the sidewall spacer. The semiconductor device further includes a silicide layer formed within the well region wherein at least a part of the silicide layer contacts a portion of the well region to bias the well region. A method of manufacturing the semiconductor device is also provided.

16 Claims, 5 Drawing Sheets

OTHER PUBLICATIONS

English language abstract for Korean Publication No. P1996-0005995.

English Language of Abstract of Japanese Patent Publication No. 11-345952.

English Language of Abstract of Japanese Patent Publication No. 2000-124450.

* cited by examiner

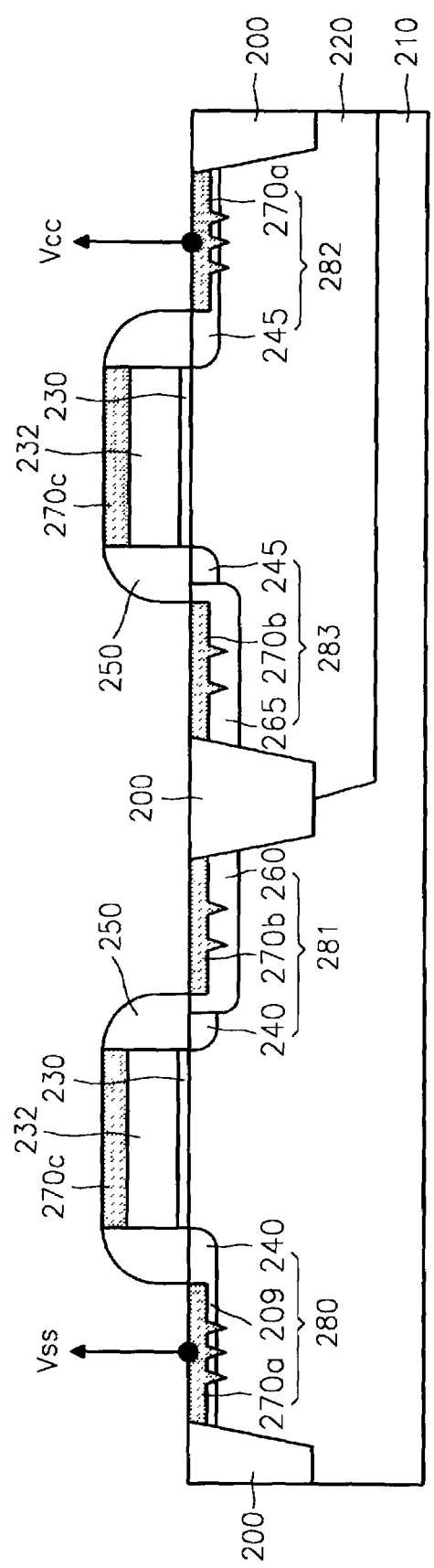

SEMICONDUCTOR DEVICE HAVING A MERGED REGION AND METHOD OF FABRICATION

BACKGROUND OF THE INVENTION

1. Field of the Invention

This invention relates generally to semiconductor devices, and, more particularly, to a semiconductor device structure for well biasing to prevent latch-up or soft errors.

2. Description of Related Art

Complementary metal-oxide semiconductor (CMOS) circuits such as CMOS static random access memory (SRAM) cells encounter problems such as latch-up or soft errors.

In CMOS circuits, latch-up occurs due to the presence of complementary parasitic bipolar transistor structures. Because n-channel and p-channel devices are in close proximity to one other in CMOS circuits, inadvertent (parasitic) p-n-p-n bipolar structures can be found. As a result, under certain biasing conditions, the p-n-p part of the structure can supply base current to the n-p-n structure, causing a large current to flow. This can cause the circuit to malfunction, or even destroy the circuit itself due to heat caused by high power dissipation. The latch-up phenomenon is triggered by a changing current incidental to fluctuation of power supply voltage, a punch through current at a well boundary, or other similar circumstances. Such triggering currents are established in any one or more of a variety of ways, including terminal overvoltage stress, transient displacement currents, ionizing radiation, or impact ionization by hot electrons.

In addition to the problem of latch-up, if energetic particles from the environment, such as alpha-particles, strike a junction, such as the drain junction, surrounded by a depletion region, electrons and holes will be generated within the underlying body of the semiconductor material and will collect along the boundary of the depletion region. The voltage across the junction will thereby be reduced by the charge perturbation. If the charge perturbation is sufficiently large, the stored logic state may be reversed, causing a so called "soft error." Latch-up and soft errors are both increased by the unstable potential of well stand-by operation at reduced voltage.

A variety of methods for suppressing latch-up and soft error have been proposed. For example, latch-up can be suppressed by providing bias voltages Vss (ground) to the p-well and Vcc (power voltage) to the n-well to set the potentials of the p-well and n-well. One such example is shown in FIG. 1. Referring to FIG. 1, a well-tie implant region 18 is formed having the same conductivity type as a well region 16 to bias the well region 16. The well-tie implant region 18 is separated from the source region 20 in the cell. Unfortunately, this method requires a large area within the cell for forming a separated well-tie implant region 18 and separated contacts 28, 30, substantially decreasing packing density of an integrated circuit. Other similar prior art methods such as one disclosed in U.S. Pat. No. 6,300,661, also require a separate portion of the cell area beside the source region for forming a well-tie region, decreasing the packing density. Also, conventional methods are limited due to precision limits inherent in the photolithography process used in forming these fine structures.

Accordingly, it would be desirable to be able to decrease the amount of space required to bias a well region for preventing latch-up and soft error in CMOS circuits, and thereby reduce cell sizes and increase packing density without being limited by the limitations of photolithography technology.

SUMMARY

The present invention provides a semiconductor device comprising an insulated gate electrode pattern formed on a well region and a method for forming the same. The semiconductor device further includes a sidewall spacer formed on sidewalls of the gate pattern, a source region and a drain region formed adjacent opposite sides of the gate pattern. In accordance with one embodiment of the present invention, the source region includes a first-concentration impurity region formed under the sidewall spacer. The source region further includes a silicide layer formed within the well region and at least a part of the silicide layer contacts a portion of the well region for biasing the well region.

In the prior art, a separate well-tie region, besides a source region, is required to bias a well region. According to preferred embodiments of the present invention, however, because a source region includes a silicide layer formed within the well region, and because at least a part of the silicide layer contacts a portion of the well region for biasing the well region, extra spaces conventionally required for forming a well-tie region can be eliminated. Thus, by merging a well-tie region with a source region, cell sizes can be reduced and packing density can be increased, without being limited by photolithography technology.

The foregoing and other objects, features and advantages of the invention will become more readily apparent from the following detailed description of preferred embodiments of the invention, which proceeds with reference to the accompanying drawings.

BRIEF DESCRIPTION OF THE DRAWINGS

FIGS. 8A and 8B are cross-sectional views of a semiconductor device in accordance with alternative embodiments of the present invention.

DETAILED DESCRIPTION

In the following description, numerous specific details are set forth to provide a thorough understanding of the present invention. However, those having ordinary skill in the art will recognize that the invention can be practiced without these specific details. In some instances, well-known structures and techniques are not shown or described in detail to avoid unnecessarily obscuring the principles of the present invention. It is to be noted that the figures shown here are exaggerated for better understanding.

Figure 1:
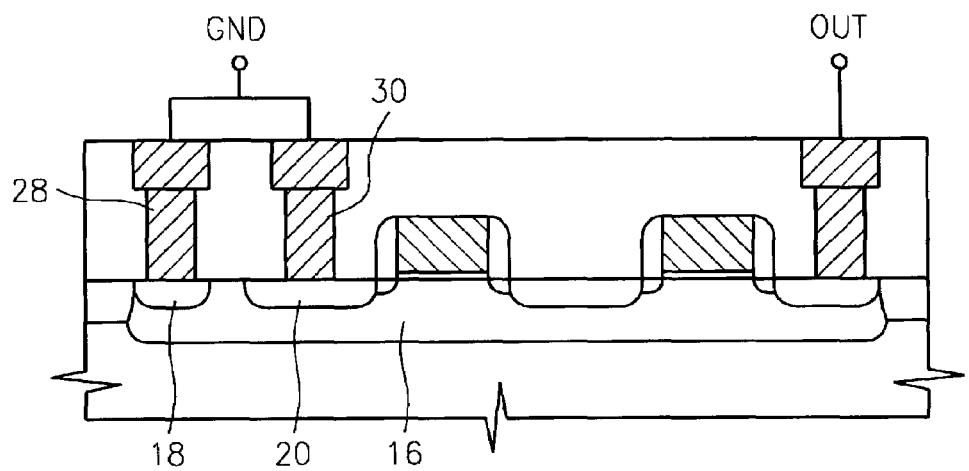
FIG. 1 is a cross-sectional view of a conventional semiconductor device
Figure 2A:
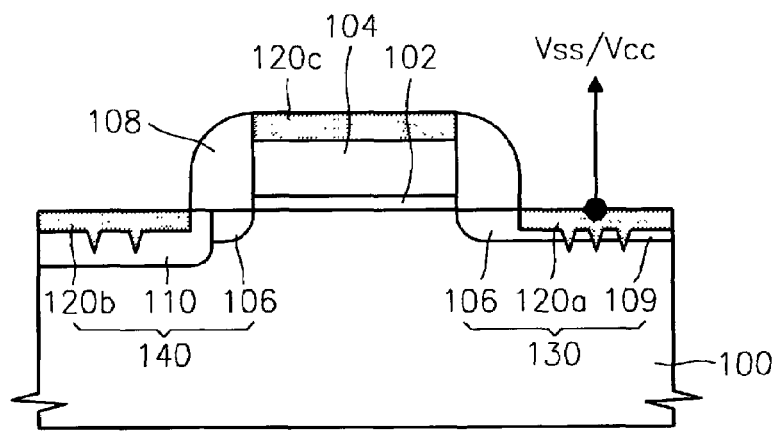
FIGS. 2A–7 are cross-sectional views of a semiconductor device at progressive stages during fabrication thereby in accordance with an embodiment of the present invention.

Referring to FIG. 2A, a well region 100 of a first-conductivity type is formed in a semiconductor substrate such as a silicon substrate. A gate insulating layer 102 and a gate electrode pattern 104 are sequentially formed on the well region 100. A source region 130 and a drain region 140 are formed adjacent opposite sides of the gate electrode pattern 104. The source region 130 includes a first-concentration impurity region 106 of a second-conductivity type formed within the well region 100. The second-conductivity type is opposite of the first-conductivity type. For example, the first-conductivity type may be n-type and the second-conductivity type may be p-type.

A sidewall spacer 108 of an insulating material, e.g., oxide or nitride, is formed on the sidewalls of the gate electrode pattern 104. The first-concentration impurity region 106 is formed under the sidewall spacer 108. The depth of the first-concentration impurity region is approximately in a range of approximately 500 to 1500 Å. The source region 130 further includes a silicide layer 120a within the well region 100. The depth of the silicide layer 120a is in a range of approximately 300 to 1000 Å. According to one embodiment of the present invention, at least a part of the silicide layer contacts a portion of the well region to bias the well region 100 sufficiently to prevent latch-up or soft errors. According to one aspect of the present invention, the source region 130 needs not include a second-concentration impurity region 110 as included in the drain region 140. Thus, the impurity regions of this embodiment of the present invention are preferably asymmetrical.

The silicide layer 120a may be formed on the first-concentration impurity region 106. In this case, the overall (average) depth of the silicide layer 120a of the source region 130 is less than the depth of the first-concentration impurity region of the source region 130, However, the silicide layer 120a needs to be close enough to the p-n junction 109, i.e., the junction between the first-impurity concentration region 106 and the well region 100, to bias the well region 100 to prevent latch-up and soft errors. The difference between the depth of the silicide layer 120a and the depth of the first-concentration impurity region 106 in the source region 130 is preferably less than approximately 500 Å.

Figure 2B:
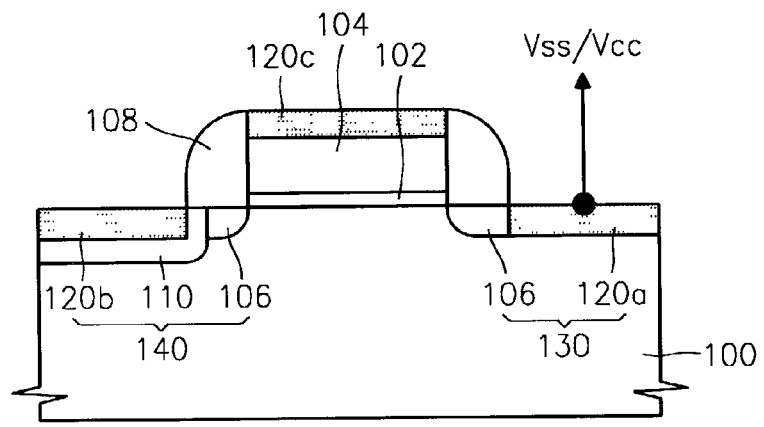

Alternatively, as shown in FIG. 2B, the depth of the silicide layer 120a may be equal to the depth of the first-concentration impurity region 106 in the source region 130. The depth of the silicide layer 120a could also be made greater than the depth of the first-concentration impurity region 106.

The semiconductor device of the present invention can further comprise a silicide layer 120c formed on the gate electrode pattern 104.

Referring to FIGS. 2A and 2B, the drain region 140 preferably includes a first-concentration impurity region 106 formed under the sidewall spacer 108, a silicide layer 120b formed adjacent the sidewall spacer 108, and a second-concentration impurity region 110 formed under the silicide layer 120b. In contrast with the silicide layer 120a in the source region 106, the silicide layer 120b in the drain region 140 does not contact the well region 100 to prevent undesirable leakage currents. The second-concentration impurity region 110 preferably has a concentration higher than the first-concentration impurity region 106. In other words, the second-concentration impurity region 110 of the second-conductivity type is formed only in the drain region 140. For this, high-dose ion-implantation is avoided in the source region 106 having the well-tie region (the silicide layer 120a) merged therein.

Using the foregoing construction, the bias-voltage supply to the well region 100 and the source region 130 of a semiconductor device, especially a CMOS circuit, can be provided at the same time using only one conductive contact. Furthermore, because the silicide layer (or well-tie region) 120a is merged into the source region 130, extra space for biasing the reference voltage to the well is not needed. For example, if a p-type well and a NMOS transistor are formed, the well region 100 and the source region 130 can be concurrently biased with the ground voltage (Vss) through the silicide layer 120a in the source region 130. If the well region 100 is an n-type well and a PMOS transistor is formed, a power source (Vcc) may be supplied to both the source region 130 and the well region 100. Therefore, a semiconductor device packing density can be substantially increased compared to conventional CMOS circuit structures.

FIGS. 3–7 illustrate a sequence of steps which may be performed to form the semiconductor topography of the preferred embodiment depicted in FIGS. 2A and 2B.

Figure 3:
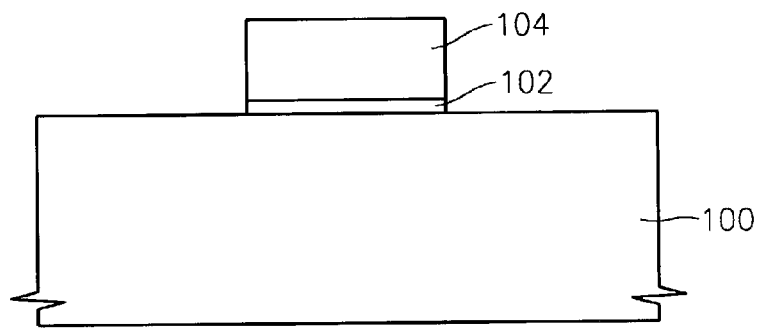

Referring to FIG. 3, a gate electrode pattern 104 is formed over a gate insulating layer 102. In particular, a first insulating layer is preferably grown by thermal oxidation on the surface of a well region 100 of a first-conductivity type in a semiconductor substrate such as a silicon substrate. A conductive layer is then formed over the first insulating layer. A doped polysilicon layer formed by chemical vapor deposition (CVD) may be used as the conductive layer. The conductive layer and the first insulating layer are then patterned into the gate electrode pattern 104 and the gate insulating layer 102, respectively, by photolithography.

Figure 4:
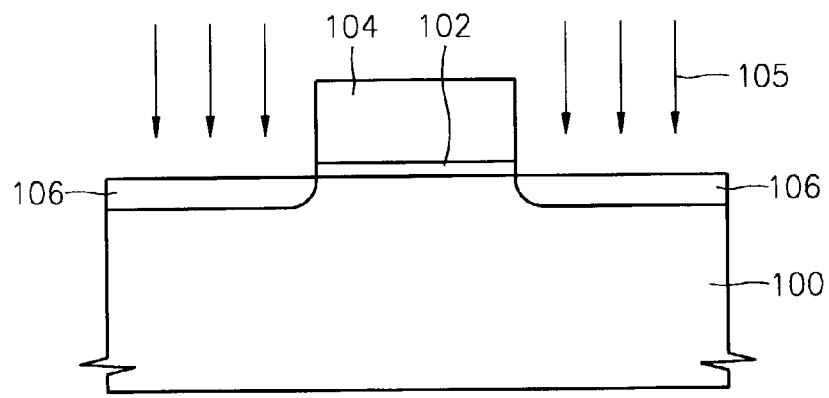

Referring to FIG. 4, first-concentration impurity regions 106 are then formed in the well region 100. Following the formation of the gate electrode pattern 104, the first-concentration impurity regions 106 are formed as LDD regions in the well region 100 on opposite sides of the gate electrode pattern 104 by ion-implanting a first dose of a first impurity of the second-conductivity type, using the gate electrode pattern 104 as a mask. The second-conductivity type is opposite the first-conductivity type.

For example, in an embodiment in which a p-type well is formed in the substrate, $n^-$ first-concentration impurity regions 106 are formed as LDD regions in the p-type well region 100 on opposite sides of the gate electrode pattern 104 by ion-implanting n-type dopants 105 using the gate electrode pattern 104 as an ion-implanting mask. Phosphorous at a dose of $1E13$ ions/cm$^2$ or above may be used. The first dosage may be $1E13$ ions/cm$^2$ or higher, and the second dose may be $1E15$ ions/cm$^2$ or higher.

Figure 5:
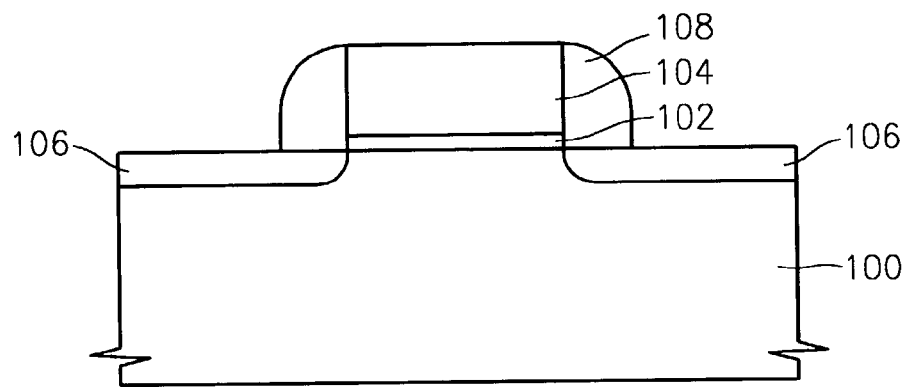

Referring to FIG. 5, sidewall spacers 108 are formed on opposite sides of the gate electrode pattern 104. After the n-type first-concentration impurity regions 106 are formed, an insulating layer is deposited on the resultant structure. The insulating layer is then etched back using anisotropic etching, such as reactive ion etching (RIE), to form the sidewall spacers 108 on the sidewalls of the gate electrode pattern 104. The insulating layer is preferably a silicidation blocking material, such as a nitride or an oxide.

Figure 6:
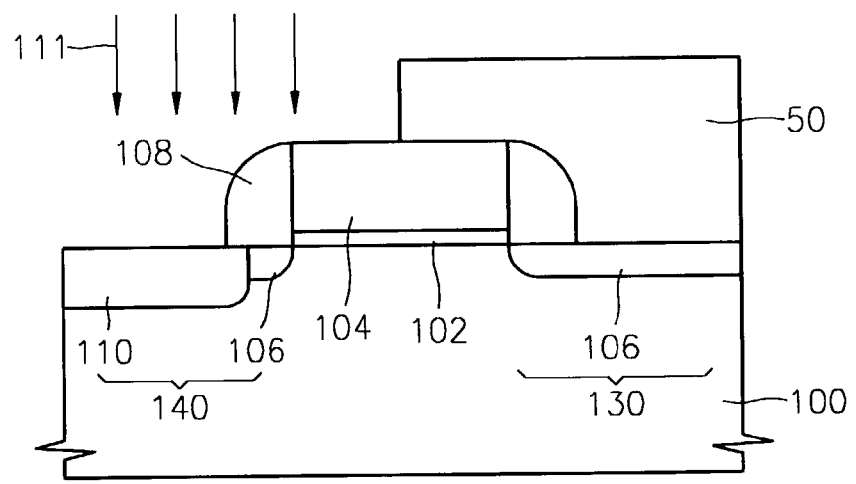

Now turning to FIG. 6, an $n^+$ second-concentration impurity region 110 is then formed. After the formation of the sidewall spacers 108, a photoresist pattern 50 is formed by photolithography to mask a source region 130. The $n^+$ second-concentration impurity region 110 is then formed as a highly concentrated drain region along a side of the sidewall spacer 108 by ion implanting n-type dopants 111, using the photoresist pattern 50 as an ion implanting mask. The dopants 111 may be, for example, arsenic at a dosage of $1E15$ ions/cm$^2$ or above. Because the region masked by the photoresist pattern 50 experiences no $n^+$ ion implantation, only an $n^-$ first-concentration impurity region exists at that region.

Figure 7:
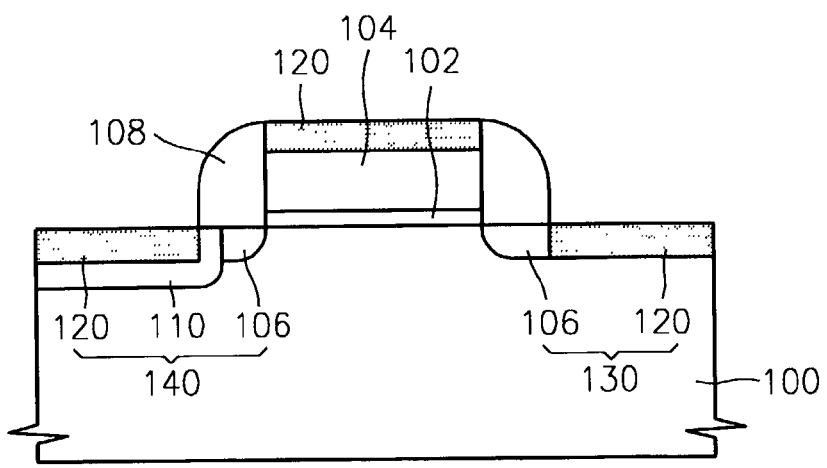

FIG. 7 illustrates the formation of a silicide layer 120. Referring to FIG. 7, after the $n^+$ second-concentration impurity region 110 is formed, the photoresist pattern 50 is removed. A silicide forming metal material such as titanium (Ti), Nickel (Ni), cobalt (Co), or tantalum (Ta) is deposited on the resultant structure. The silicide forming metal material is then subjected to rapid thermal anneal (RTA) or thermal annealing using a furnace so that silicidation takes place in an area where the metal material contacts the silicon. As a result, the silicide layer 120, such as a titanium silicide (TiSi$_2$) layer, a nickel silicide (NiSi) layer, a cobalt silicide (CoSi$_2$) layer, or tantalum silicide (TaSi$_2$) layer, is formed on the surfaces of the exposed portion of the first-concentration and the second-concentration impurity regions 130, 140 and on the gate electrode pattern 104. The thickness of the silicide forming metal material and the process conditions for the silicidation are controlled such that at least a part of the silicide layer contacts a portion of the well region to sufficiently bias the well region 100 to prevent latch-up or soft errors. Therefore, the silicide layer 120 of the source region 130 can directly contact the well region 100. Any unreacted metal material is then selectively removed using an etchant that does not damage the silicide layer 120, the semiconductor substrate, or the gate insulating layer 102.

A contact window (not shown) is formed to expose a portion of the source region 130 by depositing an insulating layer on the resultant structure and anisotropically etching the insulating layer. The etching may be carried out, for example, by RIE. A metal layer is then formed to contact the silicide layer 120 of the source region 130 by filling the contact window with a metal.

Figure 8B:
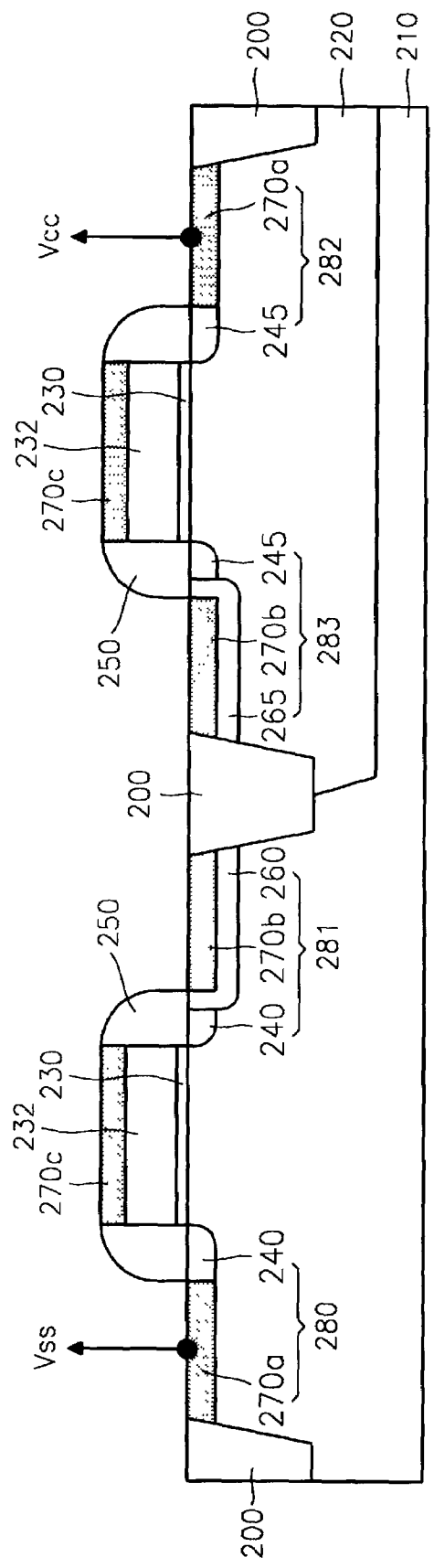

Referring to FIGS. 8A and 8B, a CMOS device (e.g., an SRAM cell) having body terminals connected to a ground (Vss) or supply voltage (Vcc) node is illustrated in accordance with another embodiment of the present invention. More particularly, trench isolation structures 200 are preferably formed on a predetermined region of a semiconductor substrate (such as a silicon substrate). A p-well region 210 and an n-well region 220 are provided adjacent to each other on the substrate. Gate insulating layers 230 and gate electrode patterns 232 are stacked on the p-well region 210 and on the n-well region 220. An NMOS transistor, formed in the p-well region 210, comprises a source region 280 having an n$^-$ first-concentration impurity region 240 and a drain region 281 having an n$^+$ second-concentration impurity region 260 overlapped with an n$^-$ first-concentration impurity region 240 in the substrate adjacent one side of the gate electrode pattern 232. The n$^+$ second-concentration impurity region 260 may be narrower than the n$^-$ first-concentration impurity region 240 in the drain region 281. Similarly, a PMOS transistor formed in the n-well region 220 comprises a source region 282 having a p$^-$ first-concentration impurity region 245 and a drain region 283 having p$^+$ second-concentration impurity region 265 overlapped with a p$^-$ first-concentration impurity region 245 in the substrate adjacent one side of the gate electrode pattern 232. Sidewall spacers 250 of an insulating material (e.g., oxide or nitride) are formed on the sidewalls of the gate electrode patterns 232.

The source regions 280, 282 and the drain regions 281, 283 of the CMOS device illustrated in FIGS. 8A and 8B have similar structural characteristics to the ones described in conjunction with FIGS. 2A and 2B. For example, the first-concentration impurity region 240, 245 is formed under the sidewall spacers 250. The depth of the first-concentration impurity region 240, 245 is approximately in a range of 500 to 1500 Å. The source regions 280, 282 each further include a silicide layer 270a within the well region 210, 220. The depth of the silicide layer 270a is preferably in a range of 300 to 1000 Å. A silicide layer 270c may be also formed over the gate electrode patterns 232.

According to one aspect of the present invention, the CMOS device illustrated in FIG. 8 includes a silicide layer 270b formed in the drain regions 281, 283 in the well regions 210, 220. The silicide layer 270b in the drain regions 281, 283 does not contact any portion of the well regions 210, 220 to prevent undesirable leakage currents as described above.

According to one embodiment of the present invention, at least a part of the silicide layer 270a contacts a portion of the well regions 210, 220 to bias the well regions 210, 220 sufficiently to prevent latch-up or soft errors.

To realize this, according to one aspect of the present invention, the source regions 280, 282 do not include a second-concentration impurity region. The silicide layer 270a in the source regions 280, 282 may be formed on the first-concentration impurity regions 240, 245. In this case, the overall (average) depth of the silicide layer 270a of the source regions 280, 282 is preferably less than the overall (average) depth of the first-concentration impurity regions 240, 245 of the source region 280, 282. However, the silicide layer 270a and the p-n junction 209 formed by the junction between the first-impurity concentration regions 240, 245 and the well regions 210, 220 need to be close enough to bias the well regions 210, 220 to prevent latch-up or soft errors. The difference between the depth of the silicide layer 270a and the depth of the first-concentration impurity regions 240, 245 in the source regions 280, 282 is less than approximately 500 Å. (As stated above, a part of the silicide layer 270a still contacts a portion of the well regions 210, 220, however, as shown in FIG. 8A.)

Alternatively, as shown in FIG. 8B, the overall (average) depth of the silicide layer 270a may be equal to the overall (average) depth of the first-concentration impurity regions 240, 245 in the source regions 280, 282. The depth of the silicide layer 270a could also be made greater than the overall (average) depth of the first-concentration impurity regions 240, 245 in the source regions 280, 282. The p-well region 210, as well as the source region 280, of the NMOS transistor, can therefore be electrically connected to a ground line (Vss) through the silicide layer 270a in the source region 280. Similarly, the n-well region 220, as well as the source region 282, of the PMOS transistor, can be electrically connected to a power supply line (Vcc) through the silicide layer 270a in the source region 282.

According to an embodiment of the present invention, a CMOS device comprises a silicide layer 270b, in the drain regions in 281, 283, which does not contact the well regions 210, 220.

It should be noted that this scheme is applicable not only for SRAM cells but also other devices adopting similar structures for biasing a reference voltage to the well region. In addition, although in FIGS. 8A and 8B the source regions 280, 282 and drain regions 281, 283 of both NMOS or PMOS transistors have the same structure, those skilled in the art will appreciate that the N- or P-MOS transistors may have different structures depending on the application.

As described above, various aspects and embodiments of the present invention reduce cell size by removing the additional space conventionally required to bias a well and the source/drain regions of a semiconductor device. In other words, the principle of the present invention substantially increases device-packing density, such as by merging the well-tie region with the source region. Consequently, the structure of the CMOS device can be miniaturized, while still preventing latch-up by providing a stable bias-voltage for the well of each cell in a CMOS SRAM device. Advantageously, this can be achieved without resorting to minimizing the dimensions of the well-tie region. The techniques of the present invention are therefore not limited to the present photolithographic technology and the process steps are simpler and less costly than those of the prior art.

Although the invention has been described with reference to preferred embodiments, it will be apparent to one of ordinary skill in the art that modifications of the described embodiments may be made without departing from the spirit and scope of the invention.

What is claimed is:

1. A semiconductor device comprising:
an insulated gate electrode pattern;
sidewall spacers formed on sidewalls of the gate pattern;
a source region and a drain region formed adjacent opposite sides of the gate pattern, the source and drain regions having a channel region disposed therebetween, the source and drain regions and the channel region having a common well region, the source region including:
   a first-concentration impurity region under one of the sidewall spacers, and
   a silicide layer formed within the first-concentration impurity region,
wherein an average depth of the silicide layer is less than an average depth of the first concentration impurity region, the silicide layer structured and arranged to be electrically connected with the common well region,
wherein the drain region includes a first-concentration impurity region under the other sidewall spacer, and a silicide layer formed adjacent the other sidewall spacer, and a second-concentration impurity region formed under the silicide layer, wherein the silicide layer does not contact any portion of the well region, and
wherein the source region does not include a second-concentration impurity region.

2. The semiconductor device of claim 1, further comprising a ground line electrically connected to the well region and the source region through the silicide layer.

3. The semiconductor device of claim 1, further comprising a power supply line electrically connected to the well region and the source region through the silicide layer.

4. The semiconductor device of claim 1, wherein the second-concentration impurity region has a concentration higher than the first-concentration impurity region.

5. The semiconductor device of claim 1, which further comprises:
a silicide layer on the gate electrode pattern.

6. The semiconductor device of claim 1, wherein a difference between an average depth of the silicide layer and an average depth of the first-concentration impurity region in the source region is less than approximately 500 Å.

7. The device of claim 1, wherein the silicide layer is close enough to a p-n junction formed between the first-impurity concentration and the common well region to bias the common well region to prevent latch-up.

8. The device of claim 1, wherein a portion of the silicide layer extends into the common well region.

9. A semiconductor device comprising:
an insulated gate electrode pattern;
a sidewall spacer formed on sidewalls of the gate pattern;
a source region and a drain region formed adjacent opposite sides of the gate pattern, the source and drain regions having a channel region disposed therebetween, the source and drain regions and the channel region having a common well region,
the source region including:
   a first-concentration impurity region formed under the sidewall spacer, and
   a first silicide layer formed within the common well region,
   wherein an average depth of the first silicide layer is less than an average depth of the first-concentration impurity region, wherein the first silicide layer structured and arranged to be electrically connected with the common well region;
and the drain region including:
   a first-concentration impurity region formed under the sidewall spacer,
   a second silicide layer formed adjacent the sidewall spacer, and
   a second-concentration impurity region under the second silicide layer,
   wherein the second silicide layer does not contact any portion of the common well region, wherein the source region does not include a second-concentration impurity region, and wherein an average depth of the second-concentration impurity region of the drain region is greater than an average depth of the first-concentration impurity region of the drain region.

10. The semiconductor device of claim 9, wherein the first silicide layer is formed on the first-concentration region.

11. The semiconductor device of claim 9, wherein the well region is p-type and the source and drain regions are n-type.

12. The semiconductor device of claim 11, which further comprises:
a ground line electrically connected to the well region and the source region through the silicide layer.

13. The semiconductor device of claim 9, wherein the well region is n-type and the source and drain regions are p-type.

14. The semiconductor device of claim 13, which further comprises:
a power supply line electrically connected to the well region and the source region through the silicide layer.

15. The device of claim 9, wherein the first silicide layer is close enough to a p-n junction formed between the first-impurity concentration and the common well region to bias the common well region to prevent latch-up.

16. The device of claim 9, wherein a portion of the first silicide layer extends into the common well region.

* * * * *